(12) United States Patent
Malenfant et al.

(10) Patent No.: US 7,226,818 B2
(45) Date of Patent: Jun. 5, 2007

(54) HIGH PERFORMANCE FIELD EFFECT TRANSISTORS COMPRISING CARBON NANOTUBES FABRICATED USING SOLUTION BASED PROCESSING

(75) Inventors: Patrick Roland Lucien Malenfant, Clifton Park, NY (US); Ji-Ung Lee, Niskayuna, NY (US); Yun Li, Schenectady, NY (US); Walter Vladimir Cicha, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/966,793

(22) Filed: Oct. 15, 2004

(65) Prior Publication Data

US 2006/0081882 A1    Apr. 20, 2006

(51) Int. Cl.
*H01L 21/8238* (2006.01)
(52) U.S. Cl. ............ 438/149; 438/153; 438/167; 438/172; 438/186; 438/197; 438/199; 257/E51.005; 257/E29.265; 977/742
(58) Field of Classification Search ............ 438/153, 438/154, 167, 169, 172, 186, 188, 197, 199, 438/201, FOR. 163, 149; 257/E51.005; 257/E29.265; 977/742
See application file for complete search history.

(56) References Cited

U.S. PATENT DOCUMENTS

| | | | | |
|---|---|---|---|---|
| 5,560,898 | A * | 10/1996 | Uchida et al. | 423/461 |
| 5,930,162 | A * | 7/1999 | Peterson | 365/151 |
| 6,616,497 | B1 | 9/2003 | Choi et al. | |
| 2002/0094311 | A1 * | 7/2002 | Smalley et al. | 422/198 |
| 2003/0186059 | A1 * | 10/2003 | Hirata et al. | 428/408 |
| 2003/0226498 | A1 * | 12/2003 | Alivisatos et al. | 117/84 |
| 2004/0206942 | A1 * | 10/2004 | Hsu | 252/500 |

FOREIGN PATENT DOCUMENTS

| | | |
|---|---|---|
| WO | WO 00/17101 | 3/2000 |
| WO | WO 01/44796 | 6/2001 |
| WO | WO 02/060812 | 8/2002 |
| WO | WO 02/095099 | 11/2002 |
| WO | WO 03/010837 | 2/2003 |
| WO | WO 03/081687 | 10/2003 |
| WO | WO 03/084869 | 10/2003 |

OTHER PUBLICATIONS

F. Brustolin, Highly Ordered Structures of Amphiphilic Polythiophenes in Aqueous Media, Jan. 3, 2002, American Chemical Society, Macromolecules 2002, 35, 1054-1059.*

(Continued)

*Primary Examiner*—Michelle Estrada
*Assistant Examiner*—Nicholas J. Tobergte
(74) *Attorney, Agent, or Firm*—Paul J. DiConza; William E. Powell, III

(57) ABSTRACT

The present invention is directed toward field effect transistors (FETs) and thin film transistors (TFTs) comprising carbon nanotubes (CNTs) and to methods of making such devices using solution-based processing techniques, wherein the CNTs within such devices have been fractionated so as to be concentrated in semiconducting CNTs. Additionally, the relatively low-temperature solution-based processing achievable with the methods of the present invention permit the use of plastics in the fabricated devices.

15 Claims, 17 Drawing Sheets

OTHER PUBLICATIONS

Dimitrakopoulos et al., "Organic Thin Film Transistors for Large Area Electronics," 14(2) Adv. Mater. (2002), pp. 99-117.

Sundar et al., "Elastomeric Transistor Stamps: Reversible Probing of Charge Transport in Organic Crystals", 303 Science (2004) pp. 1644-1647).

Baughman et al., "Carbon Nanotubes—the Route Toward Applications," 297 Science (2002) pp. 787-792.

Dai, "Carbon Nanotubes: Synthesis, Integration, and Properties," 35 Acc. Chem. Res. (2002), pp. 1035-1044.

Snow et al., "Random Networks of Carbon Nanotubes as an Electronic Material," 82(13) Appl. Phys. Lett. (2003) pp. 2145-2147.

Xiao et al., "High-Mobility Thin-Film Transistors Based on Aligned Carbon Nanotubes," 83 Appl. Phys. Letters (2003) pp. 150-152.

Martel et al., "Single- and Multi-Wall Carbon Nanotube Field-Effect Transistors", 73 Appl. Phys. Letters (1998), pp. 2447-2449.

Bradley et al., "Flexible Nanotube Electronics," 3(10) Nano Letters (2003) pp. 1353-1355.

Keren et al., "DNA-Templated Carbon Nanotube Field-Effect Transistor," 302 Science (2003) pp. 1380-1382.

McAlpine et al., "Nanoimprint Lithography for Hybrid Plastic Electronics," 3(4)Nano Letters (2003), pp. 443-445.

Duan et al., "High-Performance Thin-Film Transistors Using Semiconductor Nanowires and Nanoribbons," 425 Nature (2003), pp. 274-278.

McAlpine et al., "High-Performance Nanowire Electronics and Photonics on Glass and Plastic Substrates," 3(11) Nano Letters (2003), pp. 1531-1535.

D. Chattopadhyay et al., "A Route for Bulk Separation of Semiconducting from Metallic Single-Wall Carbon Nanotubes," 125 J. Am. Chem. Soc. (2003), pp. 3370.

M. Zheng et al., "Structure-Based Carbon Nanotube Sorting by Sequence-Dependent DNA Assembly," 302 Science (2003), pp. 1545-1548.

Weisman, "Four Degrees of Separation," 2 Nat. Mater. (2003), pp. 569-570.

M. Strano et al., "Electronic Structure Control of Single-Walled Carbon Nanotube Functionalization" 301 Science (2003), pp. 1519-1522.

L. An et al., "A Simple Chemical Route to Selectively Eliminate Metallic Carbon Nanotubes in Nanotube Network Devices," 126(34) J. Am. Chem. Soc. (2004), pp. 10520-10521.

Iijima et al., "Single-Shell Carbon Nanotubes of 1-nm Diameter," 363 Nature (1993), pp. 603-605.

Iijima, "Helical Microtubules of Graphitic Carbon," 354 Nature (1991), pp. 56-58.

Nikolaev et al., "Gas-Phase Catalytic Growth of Single-Walled Carbon Nanotubes from Carbon Monoxide," 313 Chem. Phys. Letters (1999), pp. 91-97.

Zhang et al., "Photoluminescence and Electronic Interaction of Anthracene Derivatives Adsorbed on Sidewalls of Single-Walled Carbon Nanotubes", American Chemical Society, Nano Letters, 2003, vol. 3, No. 3, pp. 403-407.

Chattopadhyay et al., "Length Separation of Zwiterion-Functionalized Single Wall Carbon Nanotubes by GPC", JACS Communications, J. Am. Chem. Soc., vol. 124, No. 5, 2002, pp. 728-729.

Zhu et al., "Improving the Dispersion and Integration of Single-Walled Carbon Nanotubes in Epoxy Composites Through Functionalization", American Chemical Society, 2003, Nano Letters, vol. 3, No. 8, pp. 1107-1113.

* cited by examiner

| 3001 | FORMING A DISPERSION OF CNTS AND FRACTIONATING AGENT |

| 3002 | CENTRIFUGING THE DISPERSION TO EFFECT FRACTIONATION OF CNTS BY ELECTRONIC TYPE |

| 3003 | TRANSFERRING SEMICONDUCTOR-ENRICHED CNTS FROM SUPERNATANT TO A SUBSTRATE |

*Fig. 3*

HIGH PERFORMANCE FIELD EFFECT TRANSISTORS COMPRISING CARBON NANOTUBES FABRICATED USING SOLUTION BASED PROCESSING

CROSS-REFERENCE TO RELATED APPLICATIONS

The present application is related to commonly assigned co-pending U.S. patent application Ser. No. 10/925,312, filed Aug. 24, 2004, incorporated by reference herein.

TECHNICAL FIELD

The present invention relates generally to methods for preparing field effect transistors (FETs), and more specifically to FETs comprising carbon nanotubes and to methods for preparing such FETs.

BACKGROUND INFORMATION

Organic-based electronic devices, in which the active semiconducting material is an organic compound (e.g., pentacene) or conjugated polymer (e.g., poly(3-alkylthiophene)), are attractive for their relatively inexpensive, low-temperature processability. However, such organic-based devices generally have limited application due to the low field effect mobilities ($\mu$) realized in such devices and their poor reliability (e.g., reproducibility, variable threshold voltage, air stability, and processability). Different organic materials have been screened in traditional organic thin film transistors (TFTs), yet the mobilities in such materials are generally not much greater than about 1 $cm^2$/Vsec (C. Dimitrakopoulos et al., "Organic Thin Film Transistors for Large Area Electronics," Adv. Mater., 2002, 14(2), 99-117). While organic TFTs with field effect mobilities of 15 $cm^2$/Vsec have been reported with pentacene devices on treated silicon via evaporation, such results have not been reproducible (T. Kelly et al., ACS ProSpective Meeting, Thin-Film Electronics: Materials, Devices, and Applications, Jan. 25-28, 2004, Miami, Fla.). Single crystals of organic materials have been shown to have mobilities as high as 10-15 $cm^2$/Vsec, but they are difficult to produce and still do not approach the mobility of 100 $cm^2$/Vsec anticipated to be required for high-performance devices and circuits (V. Sundar et al., "Elastomeric Transistor Stamps: Reversible Probing of Charge Transport in Organic Crystals," Science, 2004, 303, 1644-1647). Thus, high-performance field effect transistors (FETs) on plastic cannot be achieved with traditional organic materials, or, for that matter, with silicon, since in the latter case processing methods are limited to amorphous silicon.

It would be highly desirable to be able to manufacture high mobility TFTs with low-temperature, solution-based processing techniques that would allow low cost, high-performance devices for large area electronics. Indeed, such a processing method has been a long-sought after goal as higher mobilities would allow faster switching in high-end displays and permit logic applications (C. Dimitrakopoulos et al., "Organic Thin Film Transistors for Large Area Electronics," Adv. Mater., 2002, 14(2), 99-117). Hence, the problem to be overcome is three-fold: limited processing capability, poor performance, and poor reliability of traditional organic TFTs.

There has been considerable effort to overcome the above-described problems by replacing the semiconducting material in such TFTs with a carbon nanotube (CNT) network (Baughman et al., Carbon Nanotubes—the Route Toward Applications," Science, 2002, 297, 787-792; Dai, "Carbon Nanotubes: Synthesis, Integration, and Properties," Acc. Chem. Res., 2002, 35, 1035-1044). While CNT transistors based on the use of a single CNT per channel are not currently commercializable due to expensive, unreliable, and uncontrollable processes, CNT transistors based on CNT networks have been prepared by growing CNT networks on silicon substrates at high temperatures, temperatures that are not compatible with plastic substrates. Transport properties of such single-wall carbon nanotube (SWNT) network transistors have been reported as having mobilities of 10 $cm^2$/Vsec and $I_{on}/I_{off}$ of $10^5$. At higher SWNT densities, mobilities of 100 $cm^2$/Vsec are obtained, but with a high off current ($I_{off}$) (Snow et al., "Random Networks of Carbon Nanotubes as an Electronic Material," Appl. Phys. Lett., 2003, 82(13), 2145-2147). Furthermore, such in situ growth of CNTs directly on substrates provides an uncontrollable mixture of semiconducting and metallic tubes such that on/off ratios of such devices are poor (Xiao et al., "High-Mobility Thin-Film Transistors Based on Aligned Carbon Nanotubes," Appl. Phys. Lett., 2003, 83, 150-152). Such in situ growth processes also tend to be low yield processes.

Martel et al. (Appl. Phys. Lett., 1998, 73, 2447) prepared single-tube devices by dispersing a dilute suspension of CNTs onto a substrate and then patterned electrodes on the surface comprising the CNTs. However, this process is not practical, as described therein, and the metallic CNTs still present can lead to short-circuited devices.

The fabrication of TFTs based on single-wall carbon nanotube (SWNT) networks has been accomplished on silicon substrates from which they were then transferred to plastic substrates (Bradley et al., "Flexible Nanotube Electronics," Nano Lett., 2003, 3(10), 1353-1355). Such a transfer process is not practical or cost-effective, however, and growing tubes (individual or network) on plastic is not possible due to the high temperatures typically required.

DNA-streptavidin complexes have been used to assemble templated CNT FETs using single, isolated semiconducting CNTs (Keren et al., "DNA-Templated Carbon Nanotube Field-Effect Transistor," Science, 2003, 302, 1380-1382). However, as already mentioned, such single CNT devices are not practical and such methods still require isolation of semiconducting CNTs.

Efforts to overcome processing limitations of in situ CNT growth for FET devices have led some to fabricate silicon-based nanowires on plastic substrates (McAlpine et al., "Nanoimprint Lithography for Hybrid Plastic Electronics," Nano Lett., 2003, 3(4), 443-445; Duan et al., "High-Performance Thin-Film Transistors Using Semiconductor Nanowires and Nanoribbons," Nature, 2003, 425, 274-278; McAlpine et al., "High-Performance Nanowire Electronics and Photonics on Glass and Plastic Substrates," Nano Lett., 2003, 3(11), 1531-1535). Such nanowires are limited, as they are typically produced in very low yield and readily oxidize in air. Furthermore, inorganic nanowires suffer from trapped states on the nanowire surface and difficulties in doping.

Several recent publications have described processes to separate semiconducting SWNTs from metallic SWNTs (D. Chattopadhyay et al., "A Route for Bulk Separation of Semiconducting from Metallic Single-Wall Carbon Nanotubes," J. Am. Chem. Soc., 2003, 125, 3370; M. Zheng et al., "Structure-Based Carbon Nanotube Sorting by Sequence-Dependent DNA Assembly," Science, 2003, 302, 1545-1548; Weisman, "Four Degrees of Separation," Nat. Mater., 2003, 2, 569-570), yet no one has used these processes to fabricate TFT based on solution-cast SWNT networks that are enriched with semiconducting SWNTs.

Selective chemistry to render the metallic SWNTs non-conducting has been developed. Such chemistry selectively reacts metallic SWNTs in the presence of semiconducting SWNTs. Such chemistry disrupts the conjugation of the metallic SWNTs and effectively destroys their metallic character (M. Strano et al., Science, 2003, 301, 1519). Recently, this approach has been used to fabricate FETs comprising CNTs grown in situ on a device platform (L. An et al., "A Simple Chemical Route to Selectively Eliminate Metallic Carbon Nanotubes in Nanotube Network Devices," J. Am. Chem. Soc., 2004, 126(34), 10520-10521), but such processing still requires high temperatures to generate the CNTs and leaves chemically-destroyed metallic CNTs in the device and this chemistry is acknowledged by the authors to not be completely selective.

In light of the above, a method to inexpensively manufacture FETs, and TFTs in particular, at low temperatures using both solution-based processing and CNTs to provide high field effect mobilities would be highly desirable, as it would permit such devices to be fabricated with plastic substrates. Such resulting low-cost devices would allow their incorporation into articles of manufacture heretofore economically unrealizable.

BRIEF DESCRIPTION OF THE INVENTION

Some embodiments of the present invention are directed toward field effect transistors (FETs) comprising carbon nanotubes (CNTs) and to methods of making such devices using solution based processing techniques, wherein the CNTs within such devices have been fractionated so as to be concentrated in semiconducting CNTs. Additionally, the relatively low temperature solution-based processing methods permit the use of plastics in the fabricated devices.

Generally, such FET devices comprise: 1) a substrate; 2) a gate electrode; 3) a dielectric layer in contact with the gate electrode; 4) a semiconducting active material in contact with the dielectric layer, wherein the semiconducting active material comprises carbon nanotubes, the carbon nanotubes having been non-destructively enriched in semiconducting carbon nanotubes; and 5) source and drain electrodes in contact with the semiconducting active material.

Generally methods of making such FET devices comprise the steps of: 1) dispersing carbon nanotubes in a solvent comprising a fractionating agent to form a dispersion; 2) centrifuging the dispersion to effect, with the aid of the fractionating agent, a fractionation of carbon nanotubes by electronic type into sediment and supernatant formed by the centrifuging, such that the supernatant becomes enriched in semiconducting carbon nanotubes; and 3) transferring the carbon nanotubes from the supernatant to a substrate to serve as active semiconducting material in a field effect transistor.

Many embodiments of the present invention offer advantages over the prior art including low temperature solution-based processing, and the use of carbon nanotubes to afford enhanced performance relative to traditional organic-based FETs. Low temperature solution-based processing methods permit the use of a broad range of materials in the processing of FET devices in accordance with some embodiments of the present invention. Furthermore, use of CNTs overcomes many of the performance and operating limits of organic-based FETs, while maintaining solution based processability. Finally, the fractionation techniques described herein can enable a concentrating of semiconducting CNTs within a given CNT population capable of affording superior properties when incorporated into a FET device.

While much of the discussion herein is directed at single-wall carbon nanotubes (SWNTs), it will be understood by those of skill in the art that the scope of such exemplary embodiments can be extended to include multi-wall carbon nanotubes (MWNTs) and particularly double-wall carbon nanotubes.

In accordance with some embodiments of the present invention, applications for the devices include, but are not limited to, liquid crystal displays (LCDs), organic light emitting diode (OLED) displays, radiofrequency identification (RFID), sensors, and X-ray detectors. While some applications involve a mere replacement of existing FET devices, new applications for such FET devices will present themselves as a result of their high performance and processing flexibility.

The foregoing has outlined rather broadly the features of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is a flow diagram illustrating embodiments by which FET devices of the present invention can be fabricated;

DETAILED DESCRIPTION OF THE INVENTION

Figure 1:
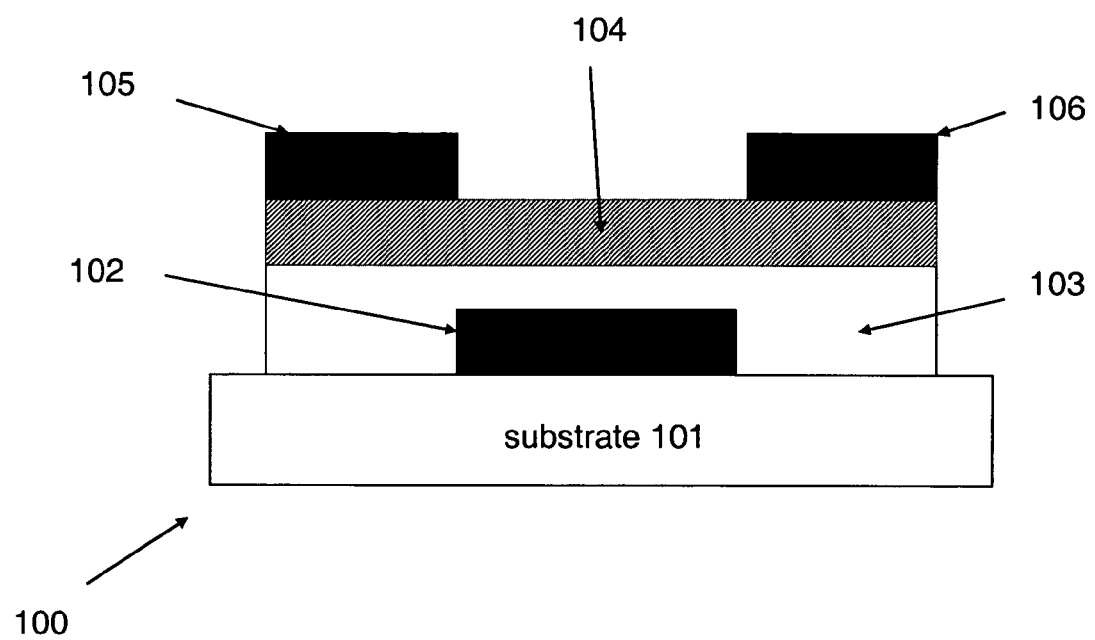
FIG. 1 illustrates a TFT device in accordance with embodiments of the present invention.

In the following description, specific details are set forth such as specific quantities, sizes, etc. so as to provide a thorough understanding of embodiments of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

Referring to the drawings in general, it will be understood that the illustrations are for the purpose of describing a particular embodiment of the invention and are not intended to limit the invention thereto.

In some embodiments, the present invention is directed toward field effect transistors (FETs) comprising carbon nanotubes (CNTs) and to methods of making such devices using solution based processing techniques, wherein the CNTs within such devices have been fractionated so as to be concentrated in semiconducting CNTs. Additionally, the relatively low temperature solution-based processing achievable with the methods of the present invention permits the use of plastics in the fabricated devices, particularly wherein such devices are thin film transistors (TFTs).

A "field effect transistor," as used herein and abbreviated "FET" is a three-terminal semiconductor device in which the current flow through one pair of terminals, the source and the drain, is controlled or modulated by an electric field that penetrates the semiconductor; this field is introduced by the voltage applied at the third terminal, the gate.

A "thin film transistor," as used herein and abbreviated "TFT" is an FET that is fabricated using thin-film techniques generally on an insulating substrate rather than on a semiconductor chip. In some embodiments, the insulating substrate is silicon with an oxide surface layer. The insulating substrate reduces the bulk capacitance of the device and hence the operating speed can be increased.

"Carbon nanotubes," as used herein and abbreviated "CNTs," refer to all-carbon tubes or cylinders having diameters on the order of about 0.5 nm to about 100 nm. "Single-wall carbon nanotubes," abbreviated "SWNTs" are but a single graphene sheet rolled upon itself to form such a cylinder (Iijima et al., "Single-Shell Carbon Nanotubes of 1-nm Diameter," Nature, 1993, 363, 603-605), whereas "multi-wall carbon nanotubes," abbreviated "MWNTs" are comprised of a plurality of such rolled sheets concentrically arranged like a Russian nesting doll (Iijima, "Helical Microtubules of Graphitic Carbon," Nature, 1991, 354, 56-58), the simplest being a double-wall carbon nanotube. The diameter and helicity of such nanotubes can be described by a roll-up vector (n,m) (Dai, "Carbon Nanotubes: Synthesis, Integration, and Properties," Acc. Chem. Res., 2002, 35, 1035-1044). When |n−m|=3k, where k is an integer or zero, the nanotube is metallic. All other combinations of n and m result in semiconducting nanotubes.

"Plastics," as used herein, generally refers to all processible forms of polymeric material, such polymeric material including, but not limited to, thermoplastics, thermosets, elastomers, and combinations thereof. "Polymeric material," is further defined to encompass polymer precursor materials (e.g., monomers), oligomers, epoxy resins, cyanate resins, and dendritic materials.

"Solvent-casting," or "solution-casting," as used herein, generally refers to the deposition of a carbon nanotube-containing solution or suspension onto a substrate. "Spin-casting," as used herein, generally refers to the deposition of such solutions/suspensions onto a spinning (i.e., rotating) substrate.

Generally, field effect transistors of the present invention comprise: 1) input and output electrodes; and 2) a semiconducting active material coupled to the input and output electrodes, wherein the semiconducting active material comprises carbon nanotubes, the carbon nanotubes having been non-destructively enriched in semiconducting carbon nanotubes.

Depending on the embodiment, the dimensions of such FET devices of the present invention can be varied considerably. Typically, the size of such devices can vary such their channel widths are between about 50 nm and about 1 mm, and their channel lengths are between about 50 nm and about 100 μm.

As a purely semiconducting population of CNTs cannot be synthesized directly (i.e., such synthesis procedures always yield mixtures of metallic and semiconducting CNTs), enrichment of a CNT mixture in either metallic or semiconducting concentration must be carried out post-synthesis. While some such methods of enrichment rely on selective chemical reactivity of metallic CNTs, these techniques are "destructive" in that they chemically alter the metallic nanotubes. The present invention relies primarily on non-destructive enrichment techniques to fractionate populations of CNTs. Such non-destructive enrichment/separation is described in commonly assigned co-pending U.S. patent application Ser. No. 10/925,312, filed Aug. 24, 2004.

More specifically, the FET devices of the present invention can comprise 1) a substrate; 2) a gate electrode; 3) a dielectric layer in contact with the gate electrode; 4) a semiconducting active material in contact with the dielectric layer, wherein the semiconducting active material comprises carbon nanotubes, the carbon nanotubes having been non-destructively enriched in semiconducting carbon nanotubes; and 5) source and drain electrodes in contact with the semiconducting active material. In some embodiments of the present invention, the FET devices of the present invention are TFTs.

Figure 2:
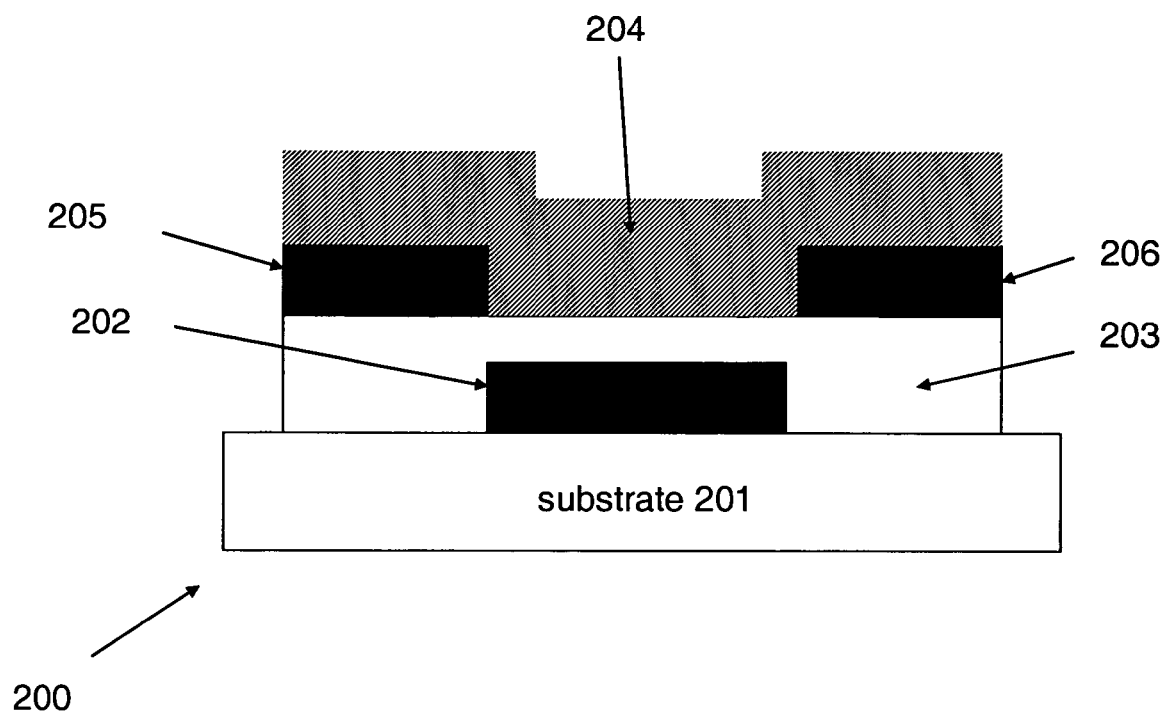
FIG. 2 illustrates another TFT device in accordance with embodiments of the present invention.

Examples of TFT devices, in accordance with some embodiments of the present invention, are shown in FIGS. 1 and 2. Referring to FIG. 1, TFT device 100 comprises a substrate 101 in contact with gate electrode 102 and dielectric layer 103. Still referring to FIG. 1, a semiconducting layer 104 resides on dielectric layer 103, and source and drain electrodes 105 and 106, respectively, reside on semiconducting layer 104. Referring to FIG. 2, TFT device 200 comprises a substrate 201 in contact with a gate electrode 202 and a dielectric layer 203. Residing on dielectric layer 203 are source and drain electrodes 205 and 206, respectively, as well as semiconducting layer 204. Other suitable configurations exist, as will be appreciated by those of skill in the art.

Substrates for devices of the present invention may be plastic. Such substrates, are not, however, limited to plastic. Substrates can be of any material or combinations of material that suitably provides for a substrate in accordance with the present invention. Other such substrate materials include, but are not limited to, silicon, glass, plastic, metal foil, ceramic, and combinations thereof.

Examples of gate electrode materials include, but are not limited to, gold, platinum, molybdenum, carbon nanotubes, conducting polymers (with and without carbon nanotubes), and combinations thereof.

Exemplary dielectric materials include, but are not limited to, $SiO_2$, nitrides, spin-on-glass, polyimides, polyvinylphenol, parylene, and combinations thereof.

As noted above, the semiconducting active material comprises CNTs. Such CNTs are generally mixtures of metallic and semiconducting CNTs that have been enriched in semiconducting nanotubes. Such CNTs can be SWNTs, MWNTs, and combinations thereof. In some embodiments, such CNT populations may comprise chemically-functionalized CNTs.

The lengths of the CNTs within such a semiconductive active layer may vary from about 20 nm to about 100 μm, but other lengths are possible outside this range. The choice of particular lengths or ranges of lengths is, at least in part, dependent upon the dimensions of the device(s) they are being incorporated into, particularly the distance between the source and drain electrodes.

In addition to CNTs, the semiconductor active region may further comprise one or more different polymeric materials, wherein the polymeric materials can be conductive polymers, non-conductive polymers, or combinations thereof. Such polymeric materials can be conjugated, non-conjugated, or combinations thereof. In some embodiments, the CNTs are dispersed in a polymeric matrix comprising such above-described polymeric material. Such polymeric materials include, but are not limited to, polythiophenes, polythiophene derivatives, poly(bithiophene-fluorenes), and combinations thereof. In some embodiments, dendritic materials are attached to such polymeric materials, i.e., dendrimers attached to a polymer backbone at one or more locations, typically one or both ends. Suitable dendritic material includes, but is not limited to, aliphatic ethers, aliphatic esters, aliphatic amines, aliphatic amides, aromatic ethers, aromatic esters, aromatic amines, aromatic amides, aromatic alkynes, phenylenes, aromatic alkenes, polyether carbamates, and combinations thereof.

In some embodiments, additional materials are added to the CNTs and/or polymeric material in the semiconducting active layer. Such additional materials include, but are limited to, polymeric material, oligomers, single-stranded DNA, polyethylenimine, $C_{60}$, aromatic organic molecules, and combinations thereof.

In some embodiments, the additional materials and/or polymeric material serves to dope or further dope the CNTs within the semiconducting active region. Such doping can be of the n-type or p-type.

Generally, the semiconducting active region comprises a CNT density that is at or above a percolation threshold, wherein a percolation threshold is defined as the minimum density of nanotubes required to obtain a conductive path between the source and drain electrodes.

The FET devices of the present invention comprising CNTs in the semiconducting active layer or region generally have field effect mobilities of about $10^{-3}$ $cm^2/Vsec$ to about $10^5$ $cm^2/Vsec$, and typically have field effect mobilities of about 0.1 $cm^2/Vsec$ to about 30 $cm^2/Vsec$. Such devices further typically have current modulation (i.e., $I_{on}/I_{off}$ ratios) of about 10 to about $10^5$.

It is important to note that in some embodiments, the FET devices of the present invention have been fabricated with materials generally not found in such devices (e.g., plastics), and that such devices made with such materials exceed the performance characteristics generally found in organic TFT devices. Such devices are made possible by the solution-based processing described below.

Applications for the above-described devices include, but are not limited to, liquid crystal displays (LCDs), organic light emitting diode (OLED) displays, radiofrequency identification (RFID), sensors, and X-ray detectors.

Generally, methods of the present invention include suspending CNTs in a solvent to form a suspension, and solvent-casting the suspension onto a substrate, wherein the CNTs serve as a bridging network between source and drain electrodes of a FET device.

In some embodiments, methods of making such FET devices comprise a number of steps. Referring to FIG. 3, the steps are: (Step 3001) dispersing carbon nanotubes (i.e., a mixture of semiconducting and metallic CNTs) in a solvent comprising a fractionating agent to form a dispersion; (Step 3002) centrifuging the dispersion to effect, with the aid of the fractionating agent, a fractionation of carbon nanotubes by electronic type into sediment and supernatant formed by the centrifuging, such that the supernatant becomes enriched in semiconducting carbon nanotubes; and (Step 3003) transferring the carbon nanotubes from the supernatant to a substrate to serves as active semiconducting material in a field effect transistor. It is an advantage of the present invention that such methods can be used in the fabrication of devices on plastic substrates and/or with plastic components.

Solvents suitable for dispersal of CNTs include, but are not limited to, N,N-dimethylformamide (DMF), chloroform ($CHCl_3$), o-dichlorobenzene (ODCB), dichloromethane ($CH_2Cl_2$), benzene, toluene, xylenes, mesitylene, dimethylsulfoxide (DMSO), water, and combinations thereof. In some embodiments, a surfactant is used to facilitate the dispersion. In some embodiments, ultrasonication and/or some form of mechanical agitation is utilized to facilitate such dispersal. In some embodiments, heat is applied to facilitate dispersal.

Fractionating agents, according to the present invention, are species that complex or associate (in a non-covalent, non-destructive way) with the carbon nanotubes in the dispersion so as to effect a fractionation of the CNTs by type (i.e., metallic and semiconducting) when centrifuged, and provide for a supernatant that is enriched in semiconducting carbon nanotubes. In some embodiments, the fractionating agents are polymeric. In some embodiments these polymeric fractionating agents are amphiphilic. In some embodiments, the polymeric fractionating agents are conductive polymers. Suitable polymers include, but are not limited to, polythiophenes, polythiophene derivatives, poly(bithiophene-fluorenes), single-stranded DNA, and combinations thereof. Suitable polythiophenes include, but are not limited to, poly-3-hexyl-thiophene (P3HT), the structure of which is shown below.

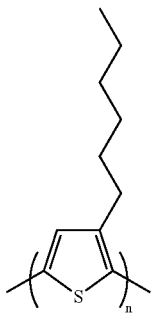

In some embodiments, the fractionating agent assists in the de-bundling and dispersion of CNTs. CNTs, especially SWNTs, tend to agglomerate into bundles or ropes held together by van der Waals forces. In such embodiments, there is generally an energetic preference for CNT contact to the fractionating agent over CNT contact to itself. Such dispersion and fractionalization are described in commonly assigned co-pending U.S. patent application Ser. No. 10/925,312, filed Aug. 24, 2004.

In some embodiments, the fractionating agents comprise dendritic material. Such dendritic material may be attached to other polymeric material. Suitable dendritic material includes, but is not limited to, aliphatic ethers, aliphatic esters, aliphatic amines, aliphatic amides, aromatic ethers, aromatic esters, aromatic amines, aromatic amides, aromatic alkynes, phenylenes, aromatic alkenes, polyether carbamates, and combinations thereof.

Centrifugation typically is carried out in a centrifuge tube at a speed between about 1000 rpm and about 5000 rpm for a duration between about 1 minute and about 20 minutes. Such centrifugation typically yields sediment and supernatant, the sediment having gravitated to the bottom of the centrifuge tube and the supernatant being the liquid on top. It is in these two phases that a fractionation of the CNT mixture is realized: the sediment being enriched in metallic CNTs and the supernatant being enriched in semiconducting CNTs—relative to the starting material.

In some embodiments, transfer of the supernatant to a substrate first involves a separation of the CNTs within the supernatant from the CNTs in the sediment. Typically this is done with simple decanting, or by optional filtration.

In embodiments wherein the fractionating agent is a polymer, the optional filtration can remove excess fractionating agent (e.g., polymer) which is not attached to CNTs, thus allowing a polymer:CNT stoichiometry to be determined. Typically, the solutions are filtered through a 4-4.5 micron (μm) sintered glass filter and then washed repeatedly with a solvent. The CNTs attached to a polymer that are isolated by filtration in this manner are either characterized as-is or redissolved in a solvent via water bath sonication (5-60 minutes, most typically 30 minutes), and then characterized.

In some embodiments, a step of isolating the CNTs from the supernatant is performed. In some embodiments, the CNTs are freed of fractionating agent and/or other materials via washings. In some embodiments, the isolated CNTs are mixed with other materials (e.g., polymer or polymer precursor materials) prior to being transferred to the substrate.

In some embodiments, the centrifugation/fractionating step and/or the optional filtration step can be repeated up to numerous times, each successive iteration leading to a supernatant more thoroughly enriched in semiconducting CNTs. Ultimately, if enough iterations are employed, isolated semiconducting CNTs could be obtained.

In some embodiments, the transferring requires an application process. Typically, such application processes are solution-based. Suitable such processes include, but are not limited to, spraying, spin-coating, brushing, rolling, printing, inkjet printing, screen printing, and combinations thereof. Solution-based transfer typically requires a solvent removal step. Typically, such solvent removal employs an evaporative means.

As mentioned above, FET devices of the present invention utilizing CNTs are typically TFT devices. In some embodiments, carbon nanotubes (CNT) are used as the active semiconductor material (or as a component of such material) in a thin film transistor (TFT) device that can be fabricated using simple, solution-based processing that permits the use of plastic substrates. Key to these devices, and the processes by which they are made, are the processes by which metallic CNTs can either be segregated, fractionated, destroyed, or even removed from the CNT population used to form the network such that the TFTs do not short circuit due to the high conductivity of the metallic CNTs.

Metallic and semiconducting CNTs may be segregated by exfoliating CNT bundles using surfactants or dispersants such as conjugated oligomers/polymers (see above). In some embodiments, these dispersants may further allow the physical separation (e.g., fractionation) of metallic from semiconducting CNTs, thus facilitating device fabrication. Selective destruction of the metallic CNTs may also be employed in order to obtain a CNT network that is more largely semiconducting. Selective destruction may be achieved chemically using known approaches such as reaction with aryl diazonium salts (Bahr et al., "Functionalization of Carbon Nanotubes by Electrochemical Reduction of Aryl Diazonium Salts: A Bucky Paper Electrode," J. Am. Chem. Soc. 2001, 123, 6536-6542).

The present invention provides a low-cost process that is solution-based and can be done at relatively low temperatures, and, as a result, is compatible with plastic substrates. In some exemplary embodiments, the present invention is directed toward devices based on SWNT networks that are obtained from SWNTs manufactured using large-scale production techniques such as the HiPco process (Nikolaev et al., "Gas-Phase Catalytic Growth of Single-Walled Carbon Nanotubes from Carbon Monoxide," Chem. Phys. Lett., 1999, 313, 91-97). These tubes are a mixture of metallic (~30%) and semiconducting (~70%) CNTs. In some embodiments, it is these CNTs that are dispersed in solution and fractionated into populations of CNTs enriched in metallic CNTs and semiconducting CNTs, so as to provide for a semiconducting network of CNTs for use in FET devices. Such CNT populations enriched in semiconducting CNTs can be further treated chemically in order to selectively render some or all of the remaining metallic tubes non-conducting, resulting in a more largely semiconducting CNT network. See, e.g., L. An et al., "A Simple Chemical Route to Selectively Eliminate Metallic Carbon Nanotubes in Nanotube Network Devices," J. Am. Chem. Soc., 2004, 126(34), 10520-10521.

It is worth noting that the use of silicon devices on plastic is limited to amorphous silicon (deposited chemically), which limits the performance of such devices on plastic (mobility ~1 $cm^2$/Vsec). This problem is addressed herein by using CNTs, such as in the form of SWNT networks, which can provide mobilities generally greater than about 10 $cm^2$/Vsec and more typically up to about 100 $cm^2$/Vsec due to the ballistic nature of transport in SWNTs. This would allow fabrication of all of the circuitry in a liquid crystal display (LCD) using SWNT devices.

In some embodiments, the present invention is directed to processes by which TFTs based on SWNT networks are fabricated. SWNT dispersions in solution are used to fabricate TFTs (using solution-based processing) in which the semiconducting channel of the TFT is a SWNT network. The first process relies on dispersions that are highly optimized such that segregating and/or fractionating metallic SWNTs from semiconducting SWNT yields a suitably semiconducting network upon deposition in a TFT channel. The use of conjugated polymers/oligomers allows and facilitates the dispersion of SWNTs such that SWNT bundles (containing both metallic and semiconducting SWNTs) can be exfoliated into individual SWNTs, and provides for fractionation of such metallic and semiconducting SWNTs from each other upon centrifuging, thus resulting in a semiconducting SWNT network upon deposition onto a substrate. The channel length can also be adjusted to assure that no individual tube spans its length, thus precluding a metallic tube, either alone or in a bundle, from short-circuiting the TFT. Other types of dispersants are also envisioned (surfactants and other non-polymeric weakly associated species, often being water soluble). The substrate may be a plastic substrate.

In some embodiments, selective reagents are employed to further modify the electronic properties of the metallic SWNT (i.e. render them non-conducting), and such is another process by which one can further obtain a semiconducting network of SWNT in the TFT channel. This may be done while dispersing the SWNT in solution, or on the TFT device directly, after the SWNT network has been formed in the device channel. This process may be combined with the use of appropriate dispersants. Examples of covalent chemistry capable of destroying metallic SWNTs include reaction with aryl diazonium salts (see above).

Another process involves the dispersion of a semiconducting SWNT (or other CNT) network into a semiconducting polymer matrix such as polythiophene. This approach may facilitate the charge injection from the source and drain electrodes into the channel and subsequently into the SWNT. This process may also be combined with SWNT physical separation or selective chemistry to destroy the metallic tubes prior to dispersing them in the semiconducting polymer.

A central feature of the present invention is the ability to make semiconducting SWNT networks from pristine SWNTs exposed to fractionation treatments and selective chemical destruction of the metallic CNTs. As such selective chemical destruction is not completely selective, the combination of these two treatments affords tremendous flexibility in the processing and higher quality semiconductor active materials that comprise such semiconducting CNTs. Furthermore, the introduction of the CNTs into a semiconducting polymer matrix, or directly onto a substrate, permits the fabrication of better-performing TFTs than traditional organics or amorphous silicon can provide. The present invention thus provides a low-cost, solution-based process for making TFTs while not sacrificing the performance of the TFT (e.g., mobilities of CNT-based TFTs can be greater than 100 $cm^2/Vsec$).

EXAMPLES

The following examples are provided to demonstrate particular embodiments of the present invention. It should be appreciated by those of skill in the art that the methods disclosed in the examples which follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

Example 1

This Example serves to illustrate how CNTs can be selectively fractionated, according to some embodiments of the present invention, by type to yield CNT populations enriched in semiconducting CNTs.

CNTs used in this Example were HiPco-produced SWNTs of purified grade obtained from Carbon Nanotechnologies, Inc. (Houston, Tex.). Such purified tubes comprised metal impurities (predominantly Fe catalyst) in a range of 2-20 weight percent. These SWNTs typically have diameters in the range of 0.7-1.3 nm, lengths in the range of 1-1.5 microns, and an average electronic bandgap of around 0.8 eV.

Figure 4:
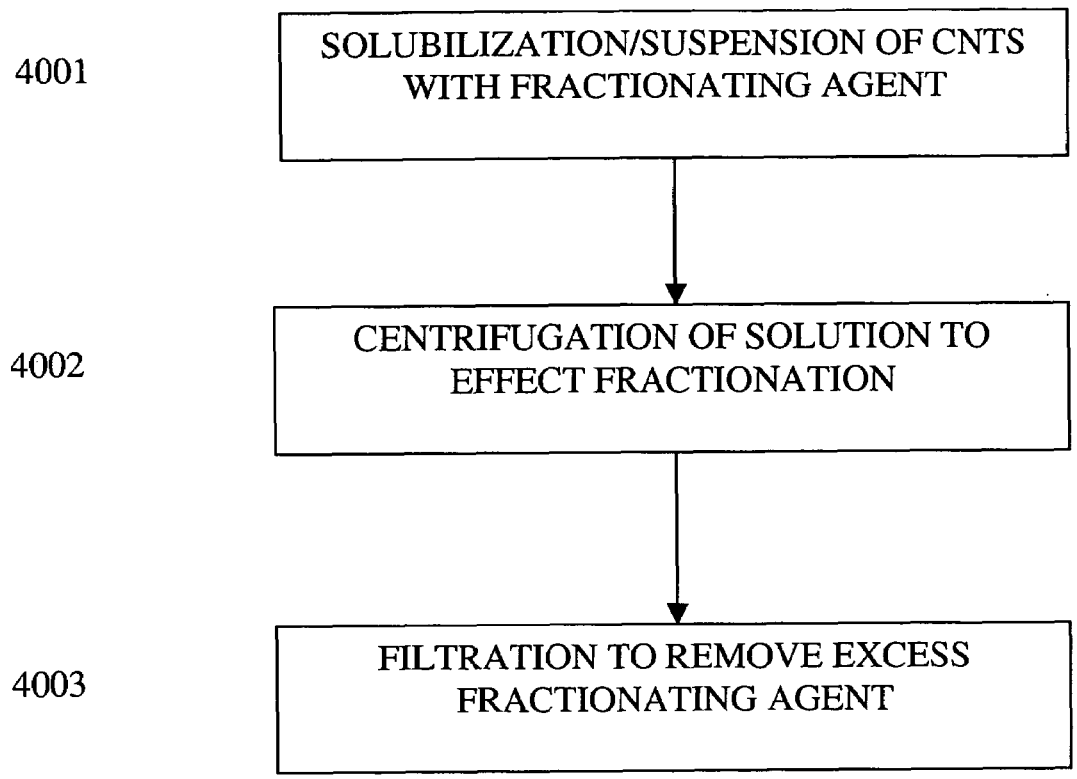
FIG. 4 is a flow diagram illustrating the steps involved in fractionating CNTs to provide CNT populations enriched in semiconducting CNTs.

Referring to FIG. 4, such fractionation typically requires three steps: (Step 4001) solubilization, (Step 4002) centrifugation, and (Step 4003) filtration. These steps are described in more detail below.

(Step 4001) Solubilization: In vial 1, 0.1-1 mg/ml of purified SWNTs were partially dispersed in a solvent, most typically $CHCl_3$, by sonicating the vial in a water bath for 5-30 minutes, most typically 15 minutes. The total weight of SWNTs used per experiment never exceeded 100 mg. The respective solubilization/fractionation agent was dissolved (by sonication in water bath) in vial 2 containing the same solvent. The weight of the fractionating agent used was such that the resulting fractionation agent:SWNT ratio ranged from 0.1:1 to 20:1 by weight, but most was typically about 1:1. The contents of vial 2 were added to vial 1 and the mixture was sonicated for between 15 minutes and 3 hours, most typically about 30 minutes. The resulting solution of wholly or partially dispersed SWNTs was then processed via purification Step 4002 and/or Step 4003 below.

(Step 4002) Centrifugation: The solution from Step 4001 was centrifuged for 2-15 minutes, most typically 5 minutes, at a speed of between about 1000 to 5000 rpm, most typically 3500 rpm. The sediment (precipitate) was separated from the supernatant (eluant) and the latter was processed either in accordance with Step 4003 below, or submitted directly for characterization. The precipitate either was characterized as-is or re-dissolved via water bath sonication (5-60 minutes, most typically 30 minutes), in a solvent, most typically $CHCl_3$, and then characterized by Raman spectroscopy. This served as a means of separating, in whole or in part, dispersed SWNTs from bundled SWNTs.

(Step 4003) Filtration: Solutions obtained directly from Step 4001, or after processing according to Step 4002, were filtered through a 4-4.5 micron sintered glass filter and then washed repeatedly with the same solvent (free fractionating agent was highly soluble in this solvent). The SWNTs isolated by such filtration were either characterized as-is or redissolved via water bath sonication (5-60 minutes, most typically 30 minutes), the solvent most typically being $CHCl_3$, and then characterized using Raman spectroscopy and ultraviolet/visible/near-infrared (UV/vis/NIR) spectroscopy. This served as a means of removing excess fractionating agent from the SWNTs and thus allowing the determination of the fractionating agent:SWNT stoichiometry.

Example 2

This Example serves to illustrate how Raman spectroscopy can be used to confirm fractionation of CNTs.

Figure 5:
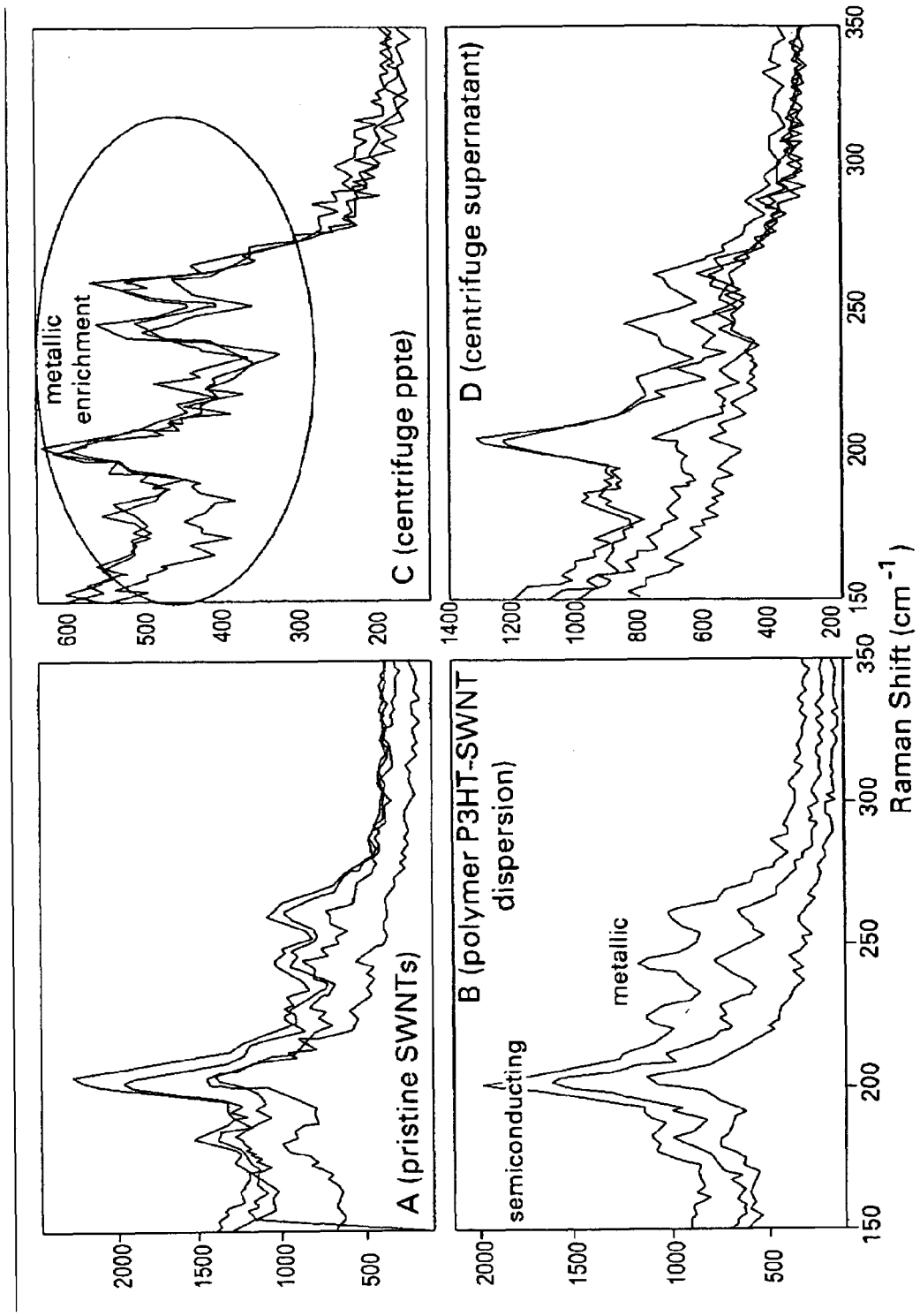
FIG. 5 is a 514 nm Raman spectra of SWNTs solvent-cast onto quartz from $CHCl_3$.

Evidence for the selective solubilization of semi-conducting SWNTs was obtained from Raman studies using a 514 nm laser light source, as shown in FIG. 5. The relative intensities of the bands in spectrum C ("centrifuge ppte," i.e., post-centrifuge sediment, in FIG. 5) are significantly different from the intensities in the other three spectra shown in FIG. 5. This comparison suggests that P3HT partially separates SWNTs into semiconducting (sc)-enriched (supernatant) and metallic (met)-enriched (sediment) portions. Analysis of the Raman data was done in accordance with previous analyses (H. Katahura et al., "Optical Properties of Single-Wall Carbon Nanotubes," Synthetic Metals, 1999, 103, 2555-2558; M. Dresselhaus et al., "Phonons in Carbon Nanotubes," Advances in Physics, 2000, 49,705-814).

While not intending to be bound by theory, Table 1 is a summary and interpretation of the radial breathing mode (RBM) region of the 514 nm Raman data obtained for soluble P3HT-SWNT dispersions solvent-cast onto quartz wafers from $CHCl_3$ solutions. The spectrum obtained for pristine, or untreated (i.e., no moiety has been attached), SWNTs indicates the presence of both semiconducting (sc) and metallic (met) SWNTs, with the intensities of the peaks of both the sc-SWNTs and met-SWNTs being relatively strong. In the spectra obtained for both the P3HT-SWNT dispersion and the supernatant ("supernatant" in Table 1), the met-SWNT peaks have decreased relative to the intensity of the sc-SWNT peaks, indicating that the supernatant is enriched in sc-SWNTs as a result of the selective functionalization and dispersion of the sc-SWNTs. In the spectrum obtained for the sediment, the situation is reversed, as the met-SWNT peaks are relatively stronger than the sc-SWNT peaks. This indicates that the sediment is enriched with met-SWNTs and, conversely, that the sc-SWNT concentration in the sediment is depleted.

Figure 6:
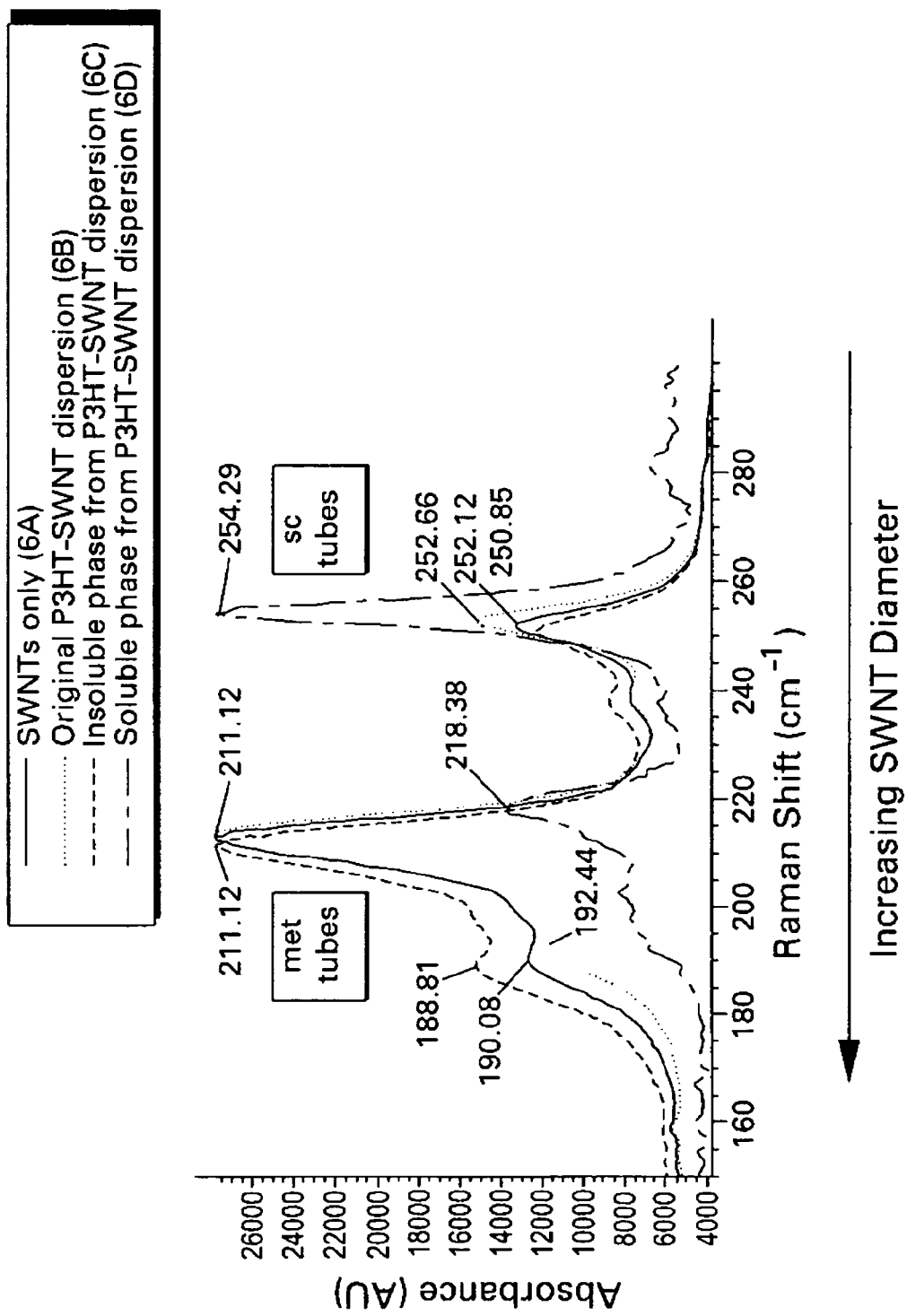
FIG. 6 shows a radial breathing mode (RBM) region 633 nm Raman spectra of SWNTs solvent-cast onto quartz from $CHCl_3$.
Figure 7:
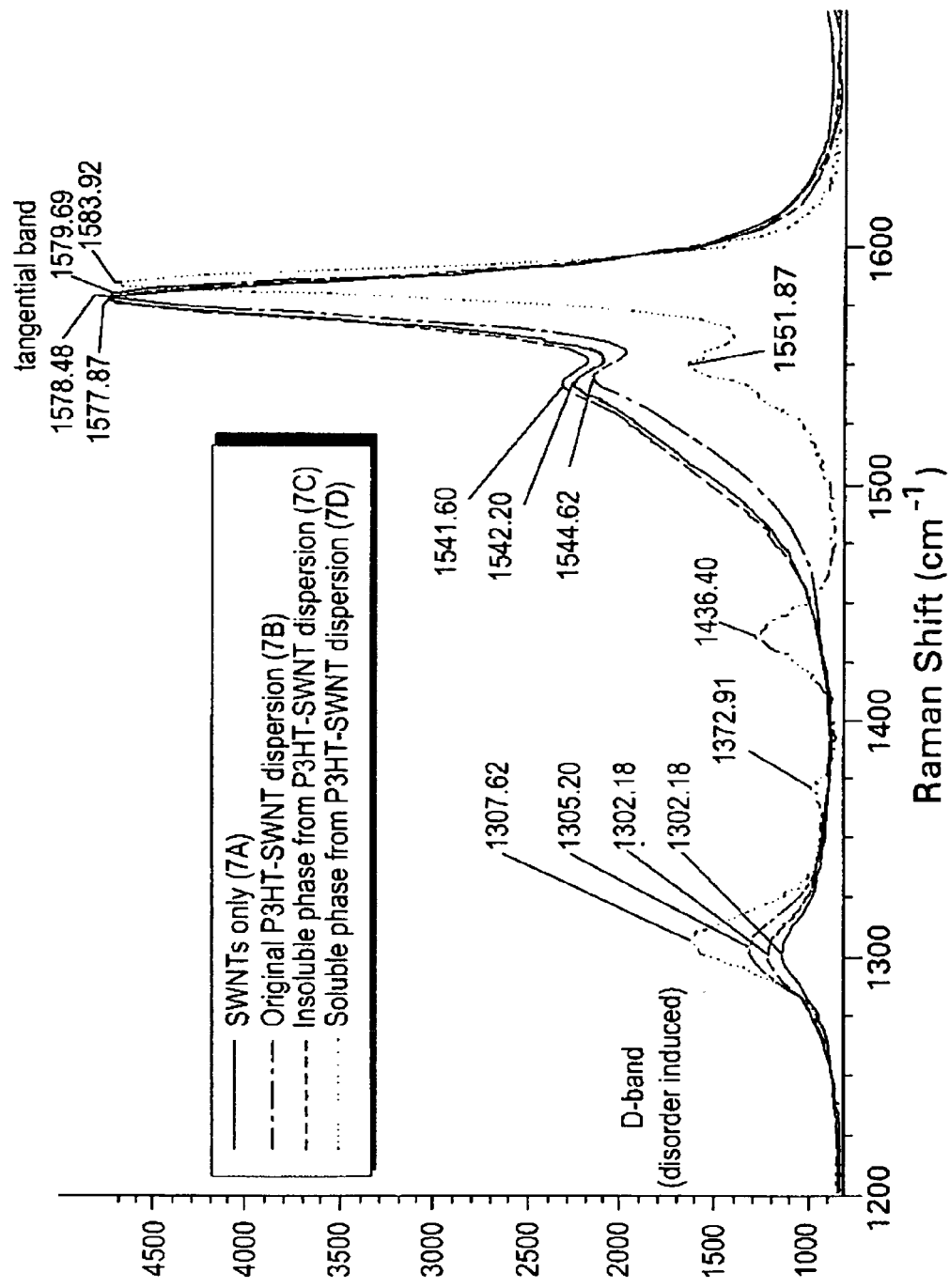
FIG. 7 shows a tangential band region 633 nm Raman spectra of SWNTs solvent-cast onto quartz from $CHCl_3$.

Raman studies using a 633 nm laser source provided further evidence for selectively dispersing semi-conducting SWNTs. FIG. 6 depicts the radial breathing mode (RBM) region of the spectra obtained. These findings strongly support selective solubilization of semi-conducting SWNTs (especially with diameters in the vicinity of 0.9 nm) and the resulting separation into an sc-enriched soluble phase and a met-enriched insoluble phase. Again, while not intending to be bound by theory, Table 2 is a summary and interpretation of the RBM region of the 633 nm Raman data for polymer P3HT-SWNT dispersions solvent-cast onto quartz wafers from $CHCl_3$ solutions.

TABLE 1

| RBM band position (+/−2 $cm^{-1}$) | SWNT Diameter (+/−0.03 nm) | Pristine SWNTs intensity | P3HT-SWNT dispersion intensity | Sediment intensity | Supernatant intensity | Assignment |
|---|---|---|---|---|---|---|
| 183 | 1.32 | m | w | w | w | sc |
| 203 | 1.18 | s | s | m–s | s | sc |
| 227 | 1.05 | w | w–m | w | w | met |
| 246 | 0.96 | m | w–m | s | w–m | met |
| 261 | 0.90 | m | w–m | s | w–m | met |

TABLE 2

| RBM band (+/−2 $cm^{-1}$) | SWNT diameter (+/−0.03 nm) | Pristine SWNTs intensity | P3HT-SWNT dispersion intensity | Sediment intensity | Supernatant intensity | Assignment |
|---|---|---|---|---|---|---|
| 190 | 1.26 | m, sh | m, sh | m, sh | — | met |
| 202 | 1.18 | m, sh | m, sh | m, sh | w | met |
| 212 | 1.12 | s | s | s | m | met |
| 218 | 1.09 | — | — | — | m | met |
| 253 | 0.93 | m | m | m | s | sc | w = weak;
m = medium;
s = strong;
sh = shoulder by significantly narrower and weaker profile of the band envelope in the 1540-1600 $cm^{-1}$ region (and the band's slight blue shift) resulting from the soluble phase (trace 7D) compared to the other three traces shown. This is consistent with the supernatant (soluble phase) having a significantly higher relative content of sc-SWNTs than any of the other three samples. Accordingly, the insoluble phase (trace 7C) has the highest met:sc SWNTs ratio. This further supports the selective solubilization of sc-SWNTs, and the resulting separation into an sc-enriched soluble phase and a met-enriched insoluble phase.

Example 3

This Example serves to illustrate a manner in which UV/vis/NIR spectroscopy can be used to confirm fractionation of CNTs.

Figure 8:
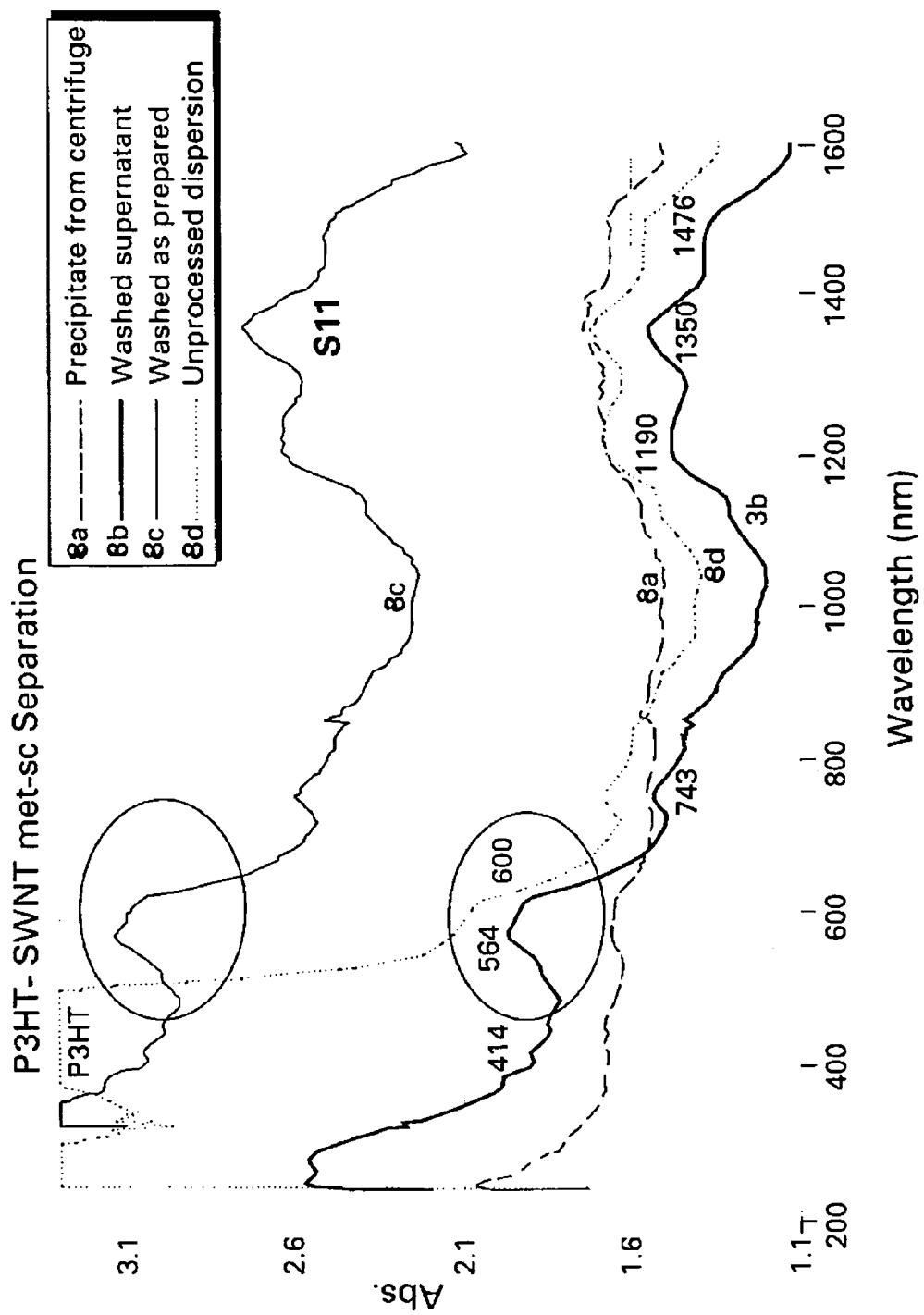
FIG. 8 is an UV/vis/NIR absorption spectrum showing the attachment of the polymer P3HT with SWNTs.
Figure 9:
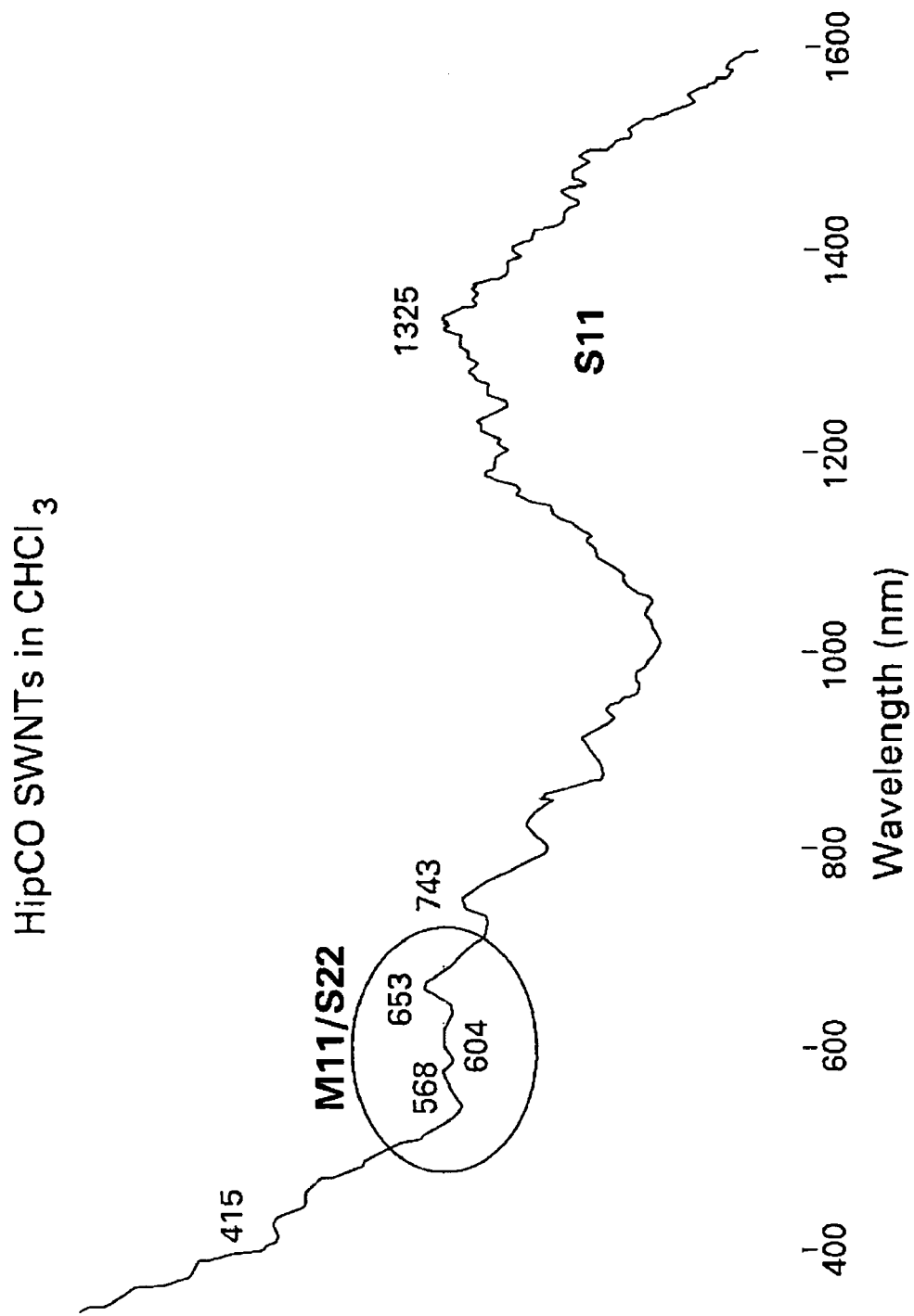
FIG. 9 is an UV/vis/NIR absorption spectrum of pristine or untreated SWNTs in $CHCl_3$.

In one particular embodiment, carbon nanotubes are dispersed by attaching at least one conjugated soluble polymer such as a polythiophene, polythiophene derivatives, a polyfluorene, or combinations thereof to the nanotube. In a particular embodiment, the conjugated soluble polymer is P3HT. While not intending to be bound by theory, the enhanced solubilization of some SWNTs by non-covalently attaching P3HT to SWNTs is shown by the UV/vis/NIR absorption spectra in FIG. 8. The UV/vis/NIR absorption spectra in FIG. 8 shows that P3HT has an affinity for the SWNTs, as evidenced by the 550-650 nm range (circled area FIG. 8). For comparative purposes, an UV/vis/NIR absorption spectrum of untreated SWNTs is shown in FIG. 9

Example 4

This Example serves to illustrate how solution-based processing techniques can be used to fabricate a TFT device comprising CNTs.

Figure 10:
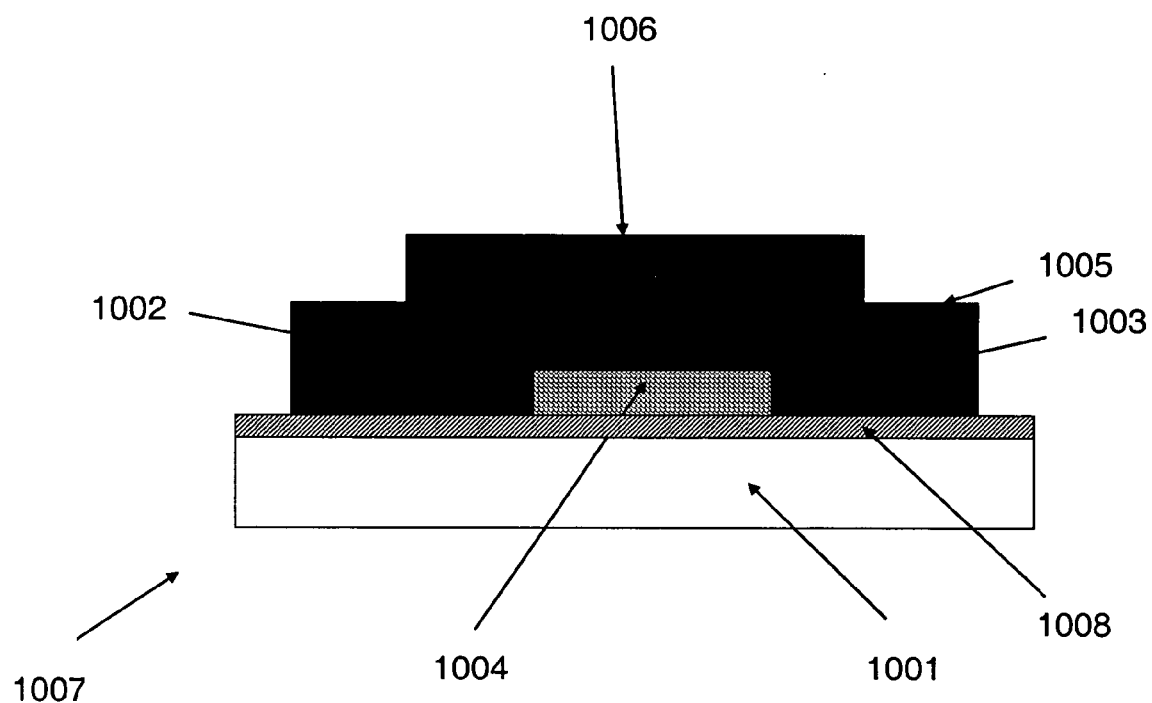
FIG. 10 illustrates yet another TFT device in accordance with embodiments of the present invention.

Referring to FIG. 10, the processing begins with a silicon (Si) wafer 1001 (comprising an ~1000 Å silicon oxide layer 1008) on which a mask is applied to pattern source and drain electrodes 1002 and 1003, respectively. SWNTs are then solution cast onto the wafer such that they fill the channel region 1004 between the source and drain electrodes. Then, a layer of dielectric material 1005 is deposited. Finally, a gate material 1006 is deposited on the dielectric layer 1005 to yield a TFT device 1007.

Example 5

This Example serves to illustrate a testing device suitable for testing and/or screening semiconducting active materials for use in TFT devices.

Figure 11:
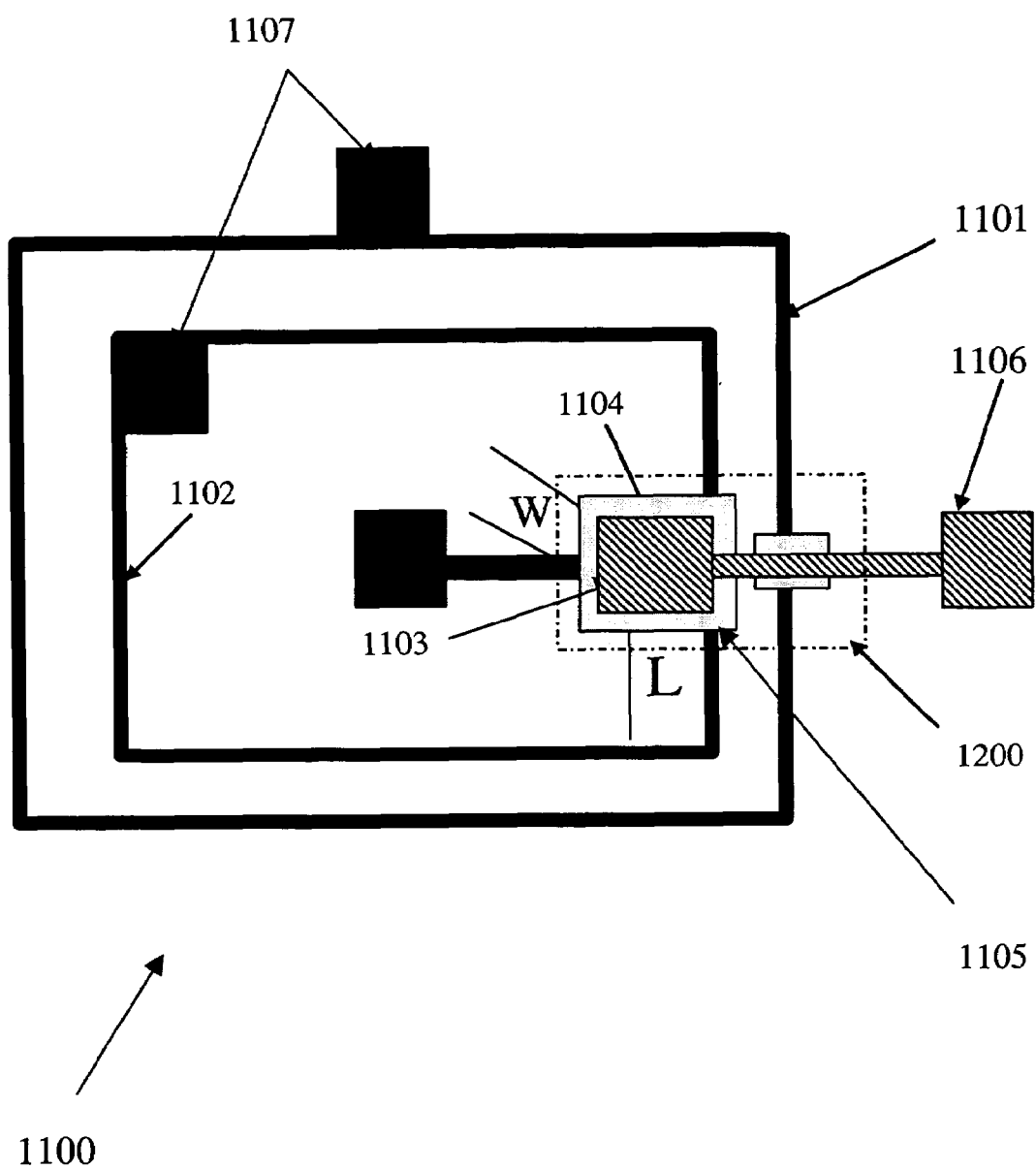
FIG. 11 illustrates a TFT testing device in accordance with Examples 5-7.
Figure 12:
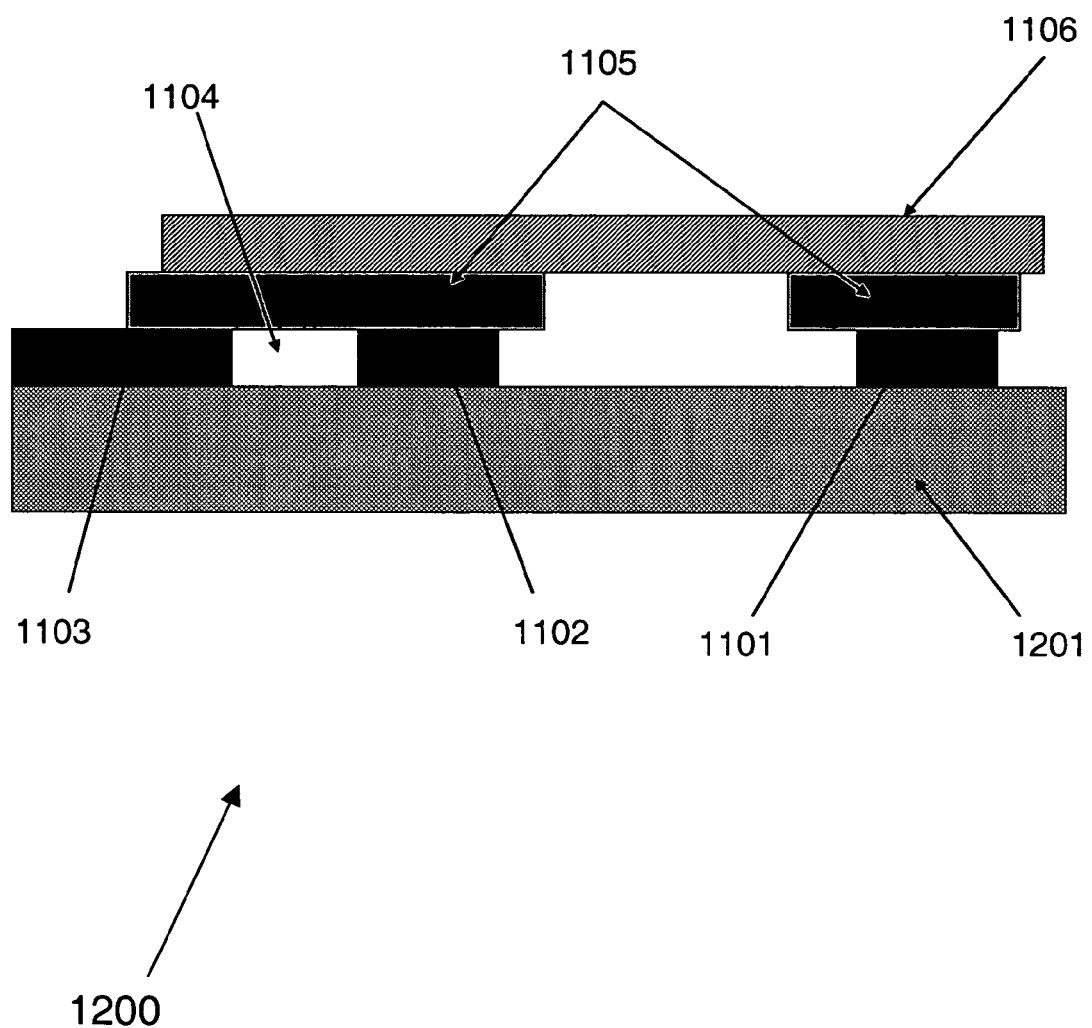
FIG. 12 is a cross-sectional side view of region 1200, identified by dashed borders in FIG. 11.

Referring to FIG. 11, test device 1100 has dimensions of 1000 μm×1000 μm. The first patterned material is metal, illustrated in black. Test device 1100 comprises a guard ring 1101, a source electrode 1102, a drain electrode 1103, and a channel region 1104 having a channel length "L" and a channel width "W." The channel region is the area between the source and drain electrodes. The channel length is defined as the distance between the source and drain electrodes and the channel width is defined as the width of the drain electrode. Typically, in such testing devices, the channel length L ranges from about 2 μm to about 100 μm, and the channel width ranges from about 10 μm to about 1000 μm. The square pads are probe pads 1107, with dimensions of 100 μm×100 μm. All metal lines are 10 μm in width. The metal can be 500 Å molybdenum, platinum, or gold. Usually, 100 Å of titanium is put beneath to promote adhesion. Region 1200, identified in FIG. 11, is shown in a cross-sectional side view in FIG. 12. Referring to FIG. 12, the first patterned layer on substrate 1201 comprises source and drain electrodes 1102 and 1103, respectively, and guard ring 1101. The second patterned layer is dielectric material 1105. The dielectric materials can be $SiO_2$, parylene, etc. The third patterned layer, 1106, is the gate layer.

Example 6

This example serves to illustrate how mobility can be increased/optimized by modulating the CNT density within the semiconducting active material.

Figure 13:
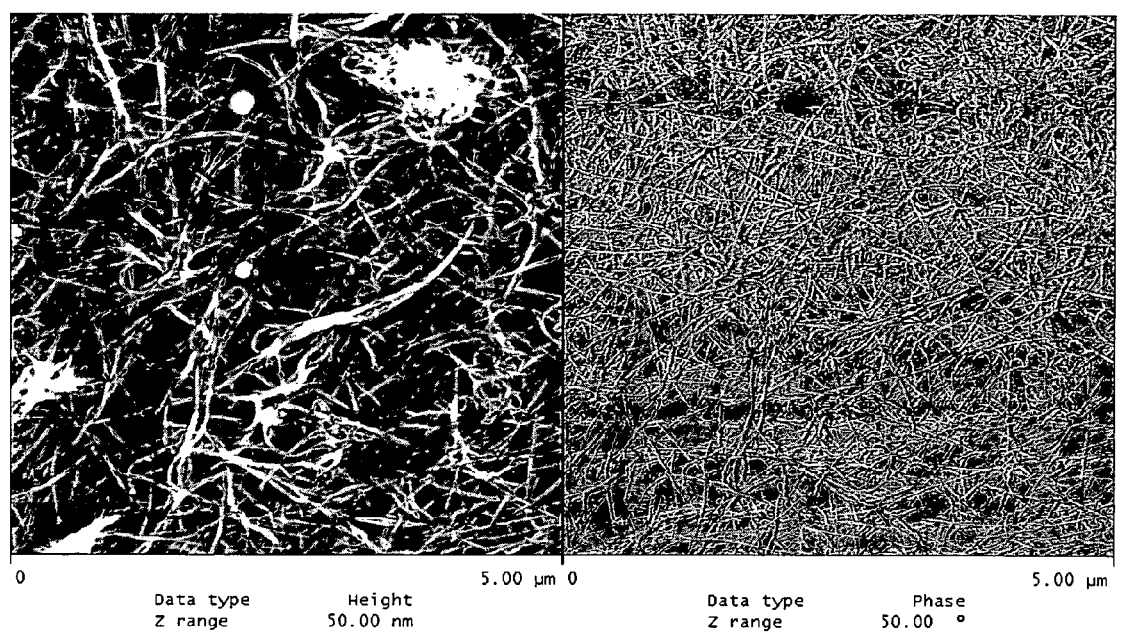
FIG. 13 is an AFM image depicting SWNT density on a substrate, according to an embodiment of the present invention.
Figure 14:
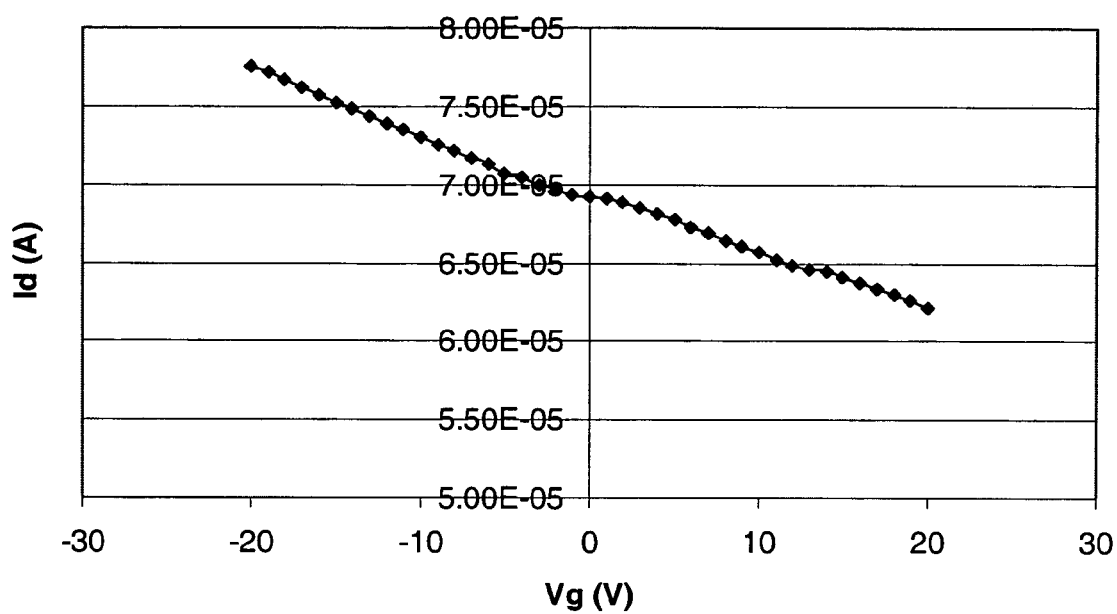
FIG. 14 is a transfer curve for the device in Example 6.

An intuitive way of increasing mobility within a CNT-based TFT device is to increase the CNT density within the semiconducting active region (i.e., the channel region). By doing this, however, the possibility of forming continuous metallic paths that bridge the source and drain electrodes also increases. Using multiple fractionation steps involving P3HT suspended SWNTs, such fractionated SWNTs were incorporated into device 1100 with a density of about 10 nanotubes per $\mu m^2$. This approximate density is illustrated visually in FIG. 13, which is a atomic force micrograph (AFM) of such nanotubes on a surface. This density of SWNTs within device 1100 yielded a mobility of around 5 $cm^2$/Vsec, as shown in the transfer curve of FIG. 14.

Example 7

This Example serves to illustrate a manner in which on/off ratios can be obtained with devices in which SWNTs have been spun cast into the channel region from a DMF suspension.

Figure 15:
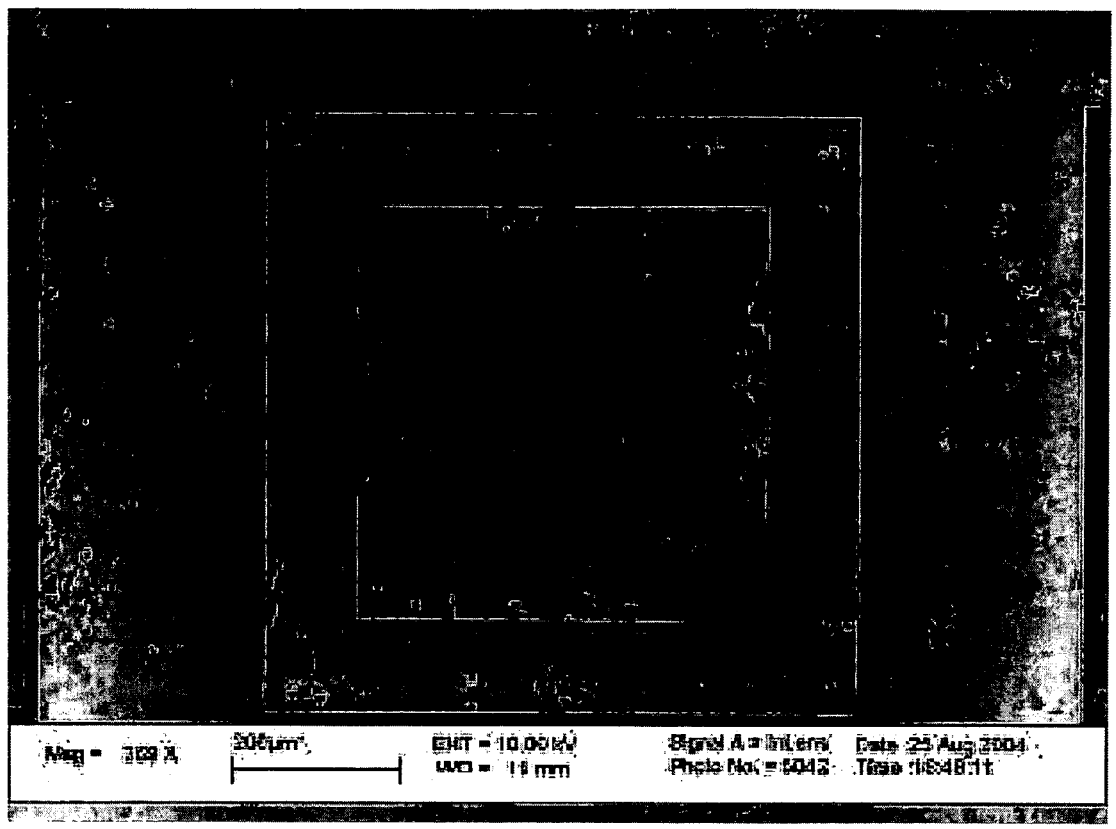
FIG. 15 is an SEM image of SWNTs dispersed onto the testing device of Example 5.
Figure 16:
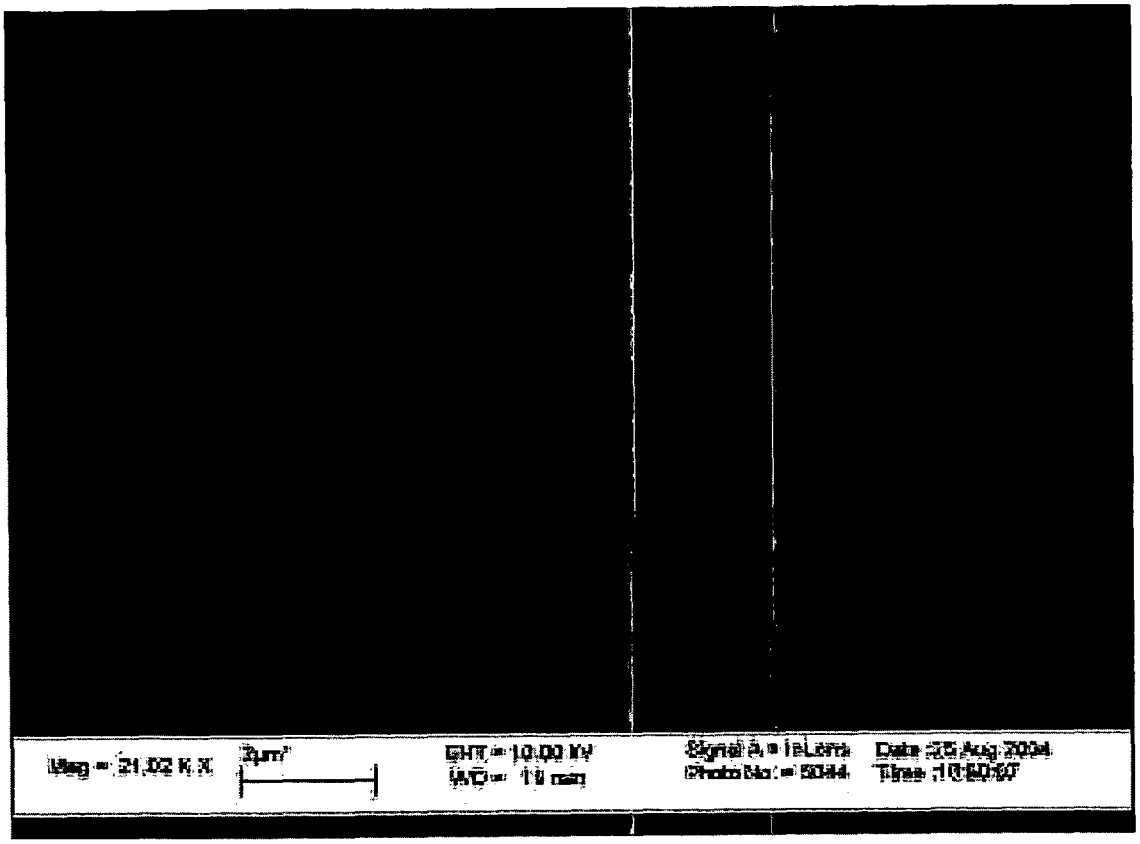
FIG. 16 is an SEM image depicting a higher magnification of one portion of the area shown in FIG. 15.
Figure 17:
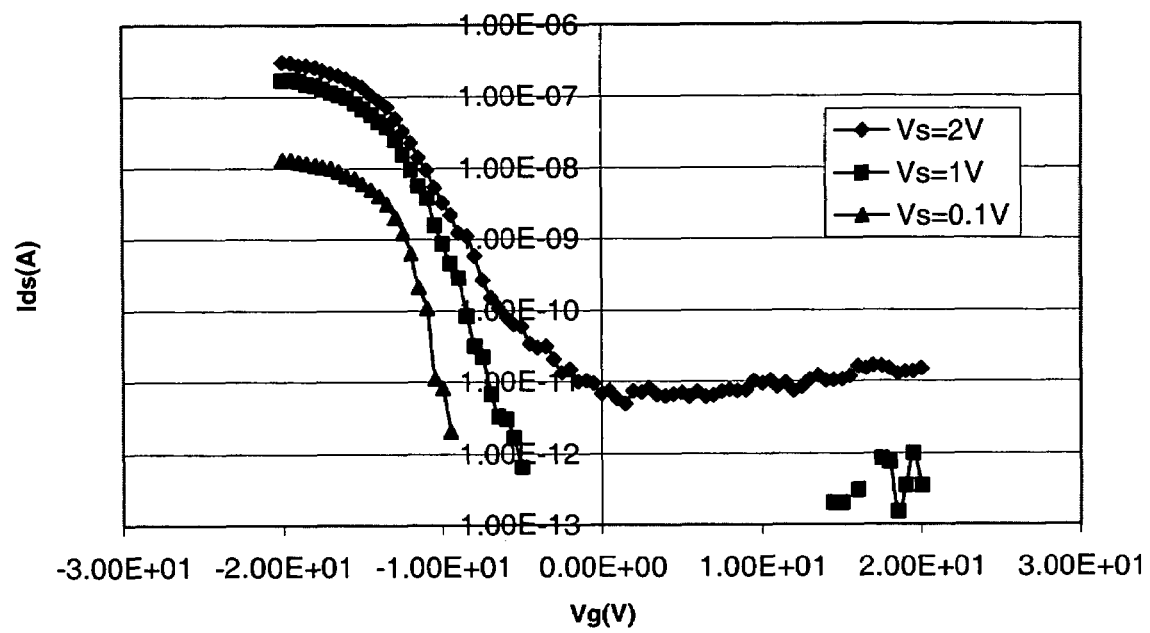
FIG. 17 depicts a transfer curve for the device in Example 7.

DMF-suspended SWNTs were spun cast into the channel region of device 1100. The resulting device is shown in the scanning electron micrographs (SEMs) of FIGS. 15 and 16, wherein FIG. 16 is a higher magnification of a region of the area shown in FIG. 15. With such devices, on/off ratios of $10^5$ and mobilities of 0.1 $cm^2$/Vsec were achieved, as shown in FIG. 17. It is worth noting, however, that as seen in the SEMs of FIGS. 15 and 16, the density of SWNTs within the device is low.

In conclusion, the present invention provides field effect transistors comprising carbon nanotubes made by solution based processing techniques, wherein the carbon nanotubes within such devices have been fractionated so as to be concentrated in semiconducting carbon nanotubes. Additionally, the relatively low temperature solution-based processing methods enable the use of plastics, and other temperature sensitive materials, in the fabricated devices.

It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:

1. A method comprising the steps of:
   a) dispersing a mixture of metallic and semiconducting carbon nanotubes in a solvent comprising a fractionating agent to form a dispersion;
   b) centrifuging the dispersion to effect, with the aid of the fractionating agent, a fractionation of carbon nanotubes by electronic type into sediment and supernatant, such that the supernatant becomes enriched in semiconducting carbon nanotubes; and
   c) transferring the carbon nanotubes from the supernatant to a substrate to serve as active semiconducting material in a field effect transistor.

2. The method of claim 1, wherein the solvent is selected from the group consisting of $CHCl_3$, $CH_2Cl_2$, ODCB, benzene, toluene, xylenes, mesitylene, DMF, DMSO, water, and combinations thereof.

3. The method of claim 1, wherein the fractionating agent is selected from the group consisting of chemical adsorbates, polymeric species, oligomeric species, surfactants, and combinations thereof.

4. The method of claim 3, wherein attached to the fractionating agent is a dendritic species.

5. The method of claim 1, wherein the fractionating agent is a polymeric species.

6. The method of claim 5, wherein the polymeric species is amphiphilic.

7. The method of claim 5, wherein the polymeric species is a conjugated polymer.

8. The method of claim 5, wherein the polymeric species is selected from the group consisting of polythiophenes, polythiophene derivatives, poly(bithiophene-fluorenes) single-stranded DNA, and combinations thereof.

9. The method of claim 5, wherein the polymeric species is P3HT.

10. The method of claim 1, wherein the step of transferring involves a transfer of the supernatant to the substrate followed by a solvent removal process.

11. The method of claim 1, wherein the step of transferring involves isolating carbon nanotubes from the supernatant prior to transferring them to the substrate.

12. The method of claim 1, wherein the step of transferring involves the transfer of carbon nanotubes in a polymeric matrix.

13. The method of claim 1, wherein the active semiconducting material further comprises at least one additional material selected from the group consisting of polymeric material, oligomeric material, aromatic organic molecules. C60, and combinations thereof.

14. The method of claim 13, wherein the additional material dopes the carbon nanotubes in a manner selected from the group consisting of n-doping and p-doping.

15. The method of claim 1, wherein at least some of the carbon nanotubes have been shortened by a process selected from the group consisting of chemical shortening processes, physical cutting processes, and combinations thereof.

* * * * *